(12) United States Patent
Madar et al.

(10) Patent No.: US 7,407,122 B2
(45) Date of Patent: Aug. 5, 2008

(54) METHOD OF PROCESSING MULTICOMPONENT, COMPOSITE AND COMBINED MATERIALS AND USE OF SO SEPARATED COMPONENTS

(75) Inventors: Ivan Madar, Krizna 12, Bratislava (SK) 811 07; Martin Juriga, A. Halasu 651/22, Dolny Kubin (SK) 026 01

(73) Assignees: Ivan Madar, Bratislava (SK); Martin Juriga, Dolny Kubin (SK)

( * ) Notice: Subject to any disclaimer, the term of this patent is extended or adjusted under 35 U.S.C. 154(b) by 125 days.

(21) Appl. No.: 10/598,630

(22) PCT Filed: Mar. 2, 2005

(86) PCT No.: PCT/SK2005/000004

§ 371 (c)(1),
(2), (4) Date: Sep. 6, 2006

(87) PCT Pub. No.: WO2005/084839

PCT Pub. Date: Sep. 15, 2005

(65) Prior Publication Data

US 2007/0179332 A1 Aug. 2, 2007

(30) Foreign Application Priority Data

Mar. 8, 2004 (SK) .................. 0133-2004

(51) Int. Cl.
*B02C 19/00* (2006.01)
(52) U.S. Cl. .................. 241/23; 241/24.14; 241/29; 241/DIG. 14; 241/DIG. 38
(58) Field of Classification Search .................. 241/23, 241/29, 24.14, DIG. 38, 14
See application file for complete search history.

(56) References Cited

U.S. PATENT DOCUMENTS

| 5,631,346 A | 5/1997 | Deckers et al. |
| 5,683,040 A | 11/1997 | Jakob et al. |
| 6,244,054 B1 | 6/2001 | Melchinger et al. |

FOREIGN PATENT DOCUMENTS

| EP | 1008395 | 6/2006 |
| JP | 08-071521 | 3/1996 |
| JP | 08-274461 | 10/1996 |
| JP | 11-076980 | 3/1999 |
| WO | 98-39368 | 9/1998 |

*Primary Examiner*—Mark Rosenbaum
(74) *Attorney, Agent, or Firm*—Oppedahl Patent Law Firm LLC

(57) ABSTRACT

The nature of the method of treating multicomponent, composite and combined materials, consisting of organic and inorganic, non-metallic and metallic components and especially of waste from electronic and electric devices and equipments, consists in that the treated materials are pretreated by removing contaminating components containing toxic heavy metals and poly-chlorinated biphenyls, by grinding the waste to particles having the size of 5 to 25 mm at most, and they are subjected, in an inert or reducing environment at a temperature of 350° C. to 600° C. and at a pressure of 100 kPa to 10 MPa, to the action of blades of a rotational mechanism for 10 seconds to 10 minutes, and to the action of a moving bed of solid particles of a substance, performing whirling motion. In this way there occurs depolymerization, cracking and state transformation of macromolecular, solid and liquid organic fractions and their separation from the composite material in the form of organic vapors and gases, and disintegration of inorganic non-metallic fractions to small particles and increase of metal concentration in the inorganic phase.

17 Claims, No Drawings

METHOD OF PROCESSING MULTICOMPONENT, COMPOSITE AND COMBINED MATERIALS AND USE OF SO SEPARATED COMPONENTS

TECHNICAL FIELD

Present invention concerns a method of processing multicomponent, composite and combined materials, and use of so separated components by effective separation of metals and other inorganic fractions comprising the multicomponent, composite material, from organic fractions by depolymerisation and decomposition of organic fractions and their separation in the form of vapours and gases.

BACKGROUND ART

Some waste materials, originating from electric and electronic equipment and devices (WEEE—waste electric and electronic equipment), for example printed circuit boards, integrated circuits, microchips, memory modules and other parts of electronic scrap have complicated composite structure, which presents a significant problem from the point of view of treating such waste material. Such composite waste materials contain valuable materials integrated with troublesome and dangerous substances in close proximity and must be processed separately for utilization or disposal. Nonferrous metals like copper, tin or lead, constitute a valuable component of electronic scrap, the content of these metals reaching up to 35% of the scrap weight. The electronic scrap often contains also noble metals, in particular silver, gold, platinum and palladium, wherein the noble metal content in some types of "high grade" integrated circuits may reach up to 0.3%.

On the other hand, complicated kinds of electric and electronic scrap often comprise troublesome and dangerous substances. Ceramics and plastics represent further components, constituting the waste, and they represent about 60% of their weight. The printed circuit boards, reinforced with glass fibers, often contain halogens, especially bromine, as a component of retardants of plastics and resins combustion. Nonseparated conductors are often isolated by PVC. In some waste materials of the electronic scrap it is possible to identify integrated capacitors, containing PCB (polychlorinated biphenyls). It is obvious that thermal treatment of such waste by standard metallurgical methods in the presence of air oxygen creates a risk of forming dioxins and furans, as well as other dangerous substances. Therefore, because of ecological, but also of economical reasons the metals as well as other valuable components of the composite waste must be separated to a high degree of purity before further utilization, what can be achieved only by extensive disintegration.

A good electronic scrap and composite waste recycling method must allow for separation of individual components in such a way that the obtained metals would contain minimum of non-metallic components and, simultaneously, it must allow recycling also for the organic fractions, especially plastics. From a pure mixture of nonferrous metals it is subsequently possible to obtain by standard metallurgical methods not only the prevailing metal-copper, but also other metals, like zinc, lead, tin, as well as silver, gold, platinum and palladium.

The presently known methods and techniques of treating and recycling multicomponent parts of waste electric and electronic devices and equipments which fulfill the above given criterion, can hardly be accepted from the ecological point of view, or they are economically highly demanding.

The most spread recent techniques of recycling composite and combined electronic scrap are based on physical, especially mechanical principles. The first stage of recycling consists usually of manual dismantling the device or apparatus and detaching simple parts. To eliminate contamination of the other components, it is necessary to remove from the composite parts, especially from the printed circuit boards, batteries containing heavy metals (nickel, cadmium), mercury switches, and PCB containing capacitors. This step is sometimes omitted or it is infeasible because of the component size. The waste composite material is subsequently mechanically disintegrated in several steps, usually in two- to four-rotor crushers, cutters and hammer mills, possibly in granulating machines. Metal iron is separated from the crushed material by a magnetic separator. The obtained crushed material without iron is subsequently sorted with the aim to separate the other metals from the remainder using various physical procedures. Vibrational sorting machine, sorting in air stream or electrostatic separators are often used. Some valuable individual components are separated from the remainder by flotation or similar methods utilizing the differences in density of the involved components and gravitation.

The products of mechanical recycling consist usually on one hand of concentrates of iron and nonferrous metals including undesired content of residua and organic substances, subsequent treating of which by metallurgical techniques is accompanied by adverse ecological consequences. On the other hand the products of such recycling are predominantly a non-metallic remainder and dust, which, as a consequence of their composition and content of residua, represent nonutilizable waste. The yield of metal recycling using the above classical procedures is limited and, moreover, a part of the noble metals becomes a part of waste, often dangerous, which makes up to 60% of the original waste composite material. Recycling of organic substances, especially macromolecular substances from composite electric and electronic waste do not belong to the worldwide background art.

Procedure, described by F. Ambrose and B. W. Dunning in the work "Accomplishments in Waste Utilization", $7^{th}$ Mineral Waste Utilization Symposium, Chicago, Oct. 20-21, 1980, Washington, US Department of the Interior, Bureau of Mines, is oriented at recycling military electronic scrap in the form of complete, undismantled switch boxes, as well as individual circuit boards. The waste is disintegrated in several stages in various devices and equipments and after each disintegration stage particles of the corresponding material are separated. Iron particles are separated magnetically and aluminum particles are separated in an eddy current separator. A cylindrical electrostatic separator may be used for treating a mixture of smaller metal particles and non-conducting residua. The final products of this treating procedure are iron, copper, aluminum, further metals and contaminated remainder, containing unseparated metals and residua. The metals may be, if necessary, refined or used directly as a starting raw material. The noble metals may be recovered by hydrometallurgical processes in specialized metal refineries. The residue cannot be usually utilized anymore and it must be treated as dangerous waste.

According to the method, described by K. O. Tillman in the work "Recycling betrieblicher Abfälle" ("Recycling industrial waste"), loose-leaf edition, July 1991, WEKA Fachverlag Kissingen 1990, isolated printed circuit boards, that have been detached from the devices, are first crushed in a two-rotor cutter crusher to particles less than 30 mm. Iron particles are removed from the resulting mixture using a magnetic separator. The remainder is cooled with liquid nitrogen to a temperature of −130° C., at which the plastic fractions become fragile. The cooled waste is ground in a continually working hammer mill and disintegrated to fine particles. The granulate is separated in a vibrational separator to a metal and a remainder fraction. The powder residue is accumulated and sent to a refinery for recovery of noble metals present. In a specialized metallurgical plant, copper is recovered, and the rare metals, present in the metal fraction, obtained in the anode mud after copper recovery, may be treated in a refinery for rare noble metals. The remaining fractions are not utilizable as raw material.

The above given methods do not ensure sufficient disintegration of the composite material and, moreover, the commonly used separation devices do not achieve sufficient level of separation. A consequence of this is that the metal fraction still contains a relatively high portion of residual materials, among others also halogens, what leads to formation of dioxins and furans during melting of metals. This reduces advantages of metal recycling from waste.

Moreover, the remainder fractions, considered to be waste, still contain 10 to 20% of metals, which fact may in case of waste thermal treating adversely influence the lifetime of the catalyst used for treatment of combustion gases.

Some disadvantages of the above procedures are eliminated by the methods described in the patent documents U.S. Pat. No. 5,683,040 and U.S. Pat. No. 6,244,054. These methods utilize, as the key operation of disintegration of composite materials, cryogenic treatment of the composite material, from which batteries, switches and capacitors, which contain harmful substances, are removed before the cryogenic treatment, and the material is ground to smaller particles. Liquid nitrogen is used as the cryogenic substance. Embrittled overcooled particles are discontinuously ground in a hammer mill, where the ground material is simultaneously separated on sieves into a fine and a coarse fraction. Coarse metallic fraction can be discontinuously taken away from the device. Of this fraction iron can be separated in a magnetic separator. The fine fraction is sorted based on the particle size into several narrow subfractions, which may be independently separated in a corona-roller separator in metallic and residual non-metallic particles. In the procedure, described in U.S. Pat. No. 6,244,054, supercooling the composite material in a cooling tank is optimized by adding it in discrete doses and by discontinuous withdrawing the supercooled material for grinding, whereby optimization of the liquid gas consumption, reduction in energy consumption, minimization of necessary human labor and working time are achieved.

Although the latter procedures yield metal concentrates of high purity, residual fractions with low content of metals, and they minimize emissions from the recycling process, they have a disadvantage that, in consequence of energy demandingness of cryogenic techniques, they approach the limits of economical acceptation because of high operation costs. Moreover, they do not allow utilization and recycling of non-metallic residua, especially organic fractions present in the composite materials.

Also known is the method of treating low-grade organic substances according to the SK patent No. 279 397, the nature of which consists in that the low-grade organic substances are subjected, at a temperature of 150° C. to 700° C. and at a pressure of 0.1 MPa to 2.5 MPa, to the action of a moving bed of solid particles which perform whirling motion, whereby the solid particles of a substance constituting the moving bed are set in whirling motion by intensive stirring.

The aim of the present invention is to eliminate disadvantages of the methods used so far, especially of the methods of recycling electric and electronic scrap, in which the key operation is disintegration of composite material.

DISCLOSURE OF INVENTION

The nature of the method of treatment of multicomponent, composite and combined materials, consisting of organic and inorganic, non-metallic and metallic components and especially of waste from electronic and electric devices and equipments, consists in that the treated materials are modified by removing contaminating components containing toxic heavy metals and polychlorinated biphenyls by grinding the waste to particles having the size of 5 to 25 mm at most, and they are subjected, in an inert or reducing environment at a temperature of 350° C. to 600° C. and at a pressure of 100 kPa to 10 MPa, to the action of blades of a rotational mechanism for 10 seconds to 10 minutes, and to the action of a moving bed of solid particles of a substance, which perform whirling motion. In this way there occurs depolymerization, cracking and state transformation of macromolecular, solid and liquid organic fractions and their separation from the composite material in the form of organic vapours and gases. Non-metallic, especially ceramic inorganic fractions are disintegrated by the destructive action of blades of the rotational mechanism to small particles, allowing to mechanically release metals from fine inorganic (micro- and nano-) structures of the composite material. Separated and released non-ferrous and noble metals, present in the multicomponent material, are able, under the above conditions, to form intermetallic phases, compounds or alloys, thus making further treatment of separated fractions, especially free metals, more effective.

The inert environment, which prevents the present substances from oxidation, is ensured by nitrogen or carbon dioxide or water vapour, or gaseous products of depolymerization, cracking and state transformation of the macromolecular, solid and liquid organic fractions, which act as inert at the above conditions.

To allow reduction of metals from their compounds present in the composite material the above process may be conducted so that the composite materials are subjected to the action of blades of a rotational mechanism in reducing environment, wherein the reducing environment is formed by hydrogen or a hydrogen releasing substance or gaseous products of depolymerization, cracking and state transformation of the macromolecular, solid and liquid organic fractions, which act as reducing.

To remove halogens and sulfur from an organic phase present in the composite material the above process may be conducted so that the multicomponent, composite and combined materials, consisting of organic and inorganic non-metallic and metallic components, are subjected to the action of blades of a rotational mechanism in alkaline environment. The alkaline environment is ensured by solid particles of an alkaline substance, performing whirling movement, which substance is a solid alkaline absorbent, like calcium oxide or calcium carbonate or calcium hydroxide or sodium hydroxide or potassium hydroxide, in which halogens and sulfur present in the organic fraction of the composite materials are chemically bounded.

The solid particles of a substance, which perform whirling movement, may be formed partially or fully by a substance which acts under the reaction conditions catalytically on the running cleaving chemical reactions or it may be a substance which is inert under the reaction conditions to the present reacting substances, such as granular quartz and/or silica sand and/or aluminosilicates and/or other natural and/or synthetic minerals, containing silicon and/or aluminum and/or calcium and/or sodium and/or potassium and/or oxygen and/or sulfur. The solid particles of a substance, which perform whirling movement, may be formed partially or fully by a substance, which results from disintegration of inorganic non-metallic fractions of the multicomponent, composite and combined materials to small particles, and by metal particles, released from the multicomponent, composite and combined materials.

Products of treatment of composite materials according to the present method are on one hand organic gaseous and liquid hydrocarbons of medium and/or high boiling range, which are withdrawn from the process in the condensation part of the device and can be utilized in various ways, most simply as a source of thermal energy. On the other hand finely ground solid phase is withdrawn from the device from which phase all organic and volatile substances, including water, are removed and which contains all inorganic components, i.e. metals and non-metals present in the original composite material. In consequence of organic substances removal, the content of which in composite materials usually ranges from 35 to 50% by weight, concentration of metals in the inorganic phase is increased, thus making the subsequent operations oriented to metal recovery more effective. The primary metal concentrate can be valuated by various methods with the aim to recover present nonferrous and noble metals. Metals as forgeable material are not fragile, and therefore, during the action of the blades of a rotational mechanism they are not liable to disintegration. This fact may preferably be utilized for separation of nonferrous metals, especially of copper and aluminum, from noble metals. Nonferrous metals occur in greater particles, while noble metals are mostly finely dispersed. Sorting the primary concentrate on sieves may lead to separation of the coarse fraction with prevailing content of copper and aluminum from a fine fraction or fine fractions of various granulometry with prevailing content of noble metals. Further increase of metal content can be achieved in granulometrically-separated fractions by separation of inorganic particles using a corona-roller separator. This may be done also with the primary metal concentrate. The primary metal concentrate or granulometrically sorted fractions, possibly fractions, from which inorganic substances have been removed in a corona-roller separator, are suitable for final recovery and refining metals by classical thermal metallurgical processes, for example by means of lead in a shaft furnace, possibly in an English furnace, or by chemical metallurgical processes, the so called wet process, for example by successive dissolving the noble metals using solutions of cyanides, aqua regia, hydrochloric acid etc.

Using the above procedure metals are concentrated and inorganic fractions are separated from the organic fractions, comprising the multicomponent, composite and combined material.

The respective separated organic, gaseous and liquid fractions may be used to produce alternative fuels, and the inorganic components, like the metal concentrate, may be used for metallurgical treatment, wherein the inorganic fraction will be divided according to the particle size to finer and coarser components by sorting on sieves and from the so obtained fractions non-metallic particles will be removed in an electrostatic separator.

The method of the present invention allows, for example, economically and ecologically advantageous recycling of waste electric and electronic devices and equipments or their parts, for example waste printed circuit boards, microchips and integrated circuits, memory modules and other complicated kinds of electric and electronic scrap.

EXAMPLE OF EMBODIMENT OF THE INVENTION

In an operating research equipment BLOWDEC, built according to the SK patent No. 279 397 with the input power of 45 kW a whirling moving bed has been created, the solid particles of which comprised common silica sand. After heating to 450° C. crushed electronic scrap has been continuously fed to the reaction chamber using a screw conveyer. The electronic scrap has consisted mainly of a mixture of ground waste printed circuits from dismantled amortized computer equipments. Batteries and greater capacitors have been removed from the printed circuits before grinding in a cutter mill. The size of the ground particles was up to 10 mm and iron particles have been removed from the ground material in a magnetic separator.

Simultaneously, water vapour has been fed to the reaction chamber as an inert medium in an amount of 0.75% of the batch weight. In the reaction chamber with whirling moving bed, cleaving and depolymerizing reactions of plastics and resins, which formed a part of the electronic scrap, took place at a temperature of 450° C. and at a pressure of 120 kPa. Gaseous reaction products have been lead to the condensation part of the BLOWDEC device and here intensively cooled in a raschig rings filed quench condenser. Heavy gas oil has been used as the primary cooling medium. Simultaneously, the crushed inorganic phase has been continuously withdrawn from the process chamber by means of a discharging device.

The solid phase has been analyzed with the aim to determine the content of relevant metals and major inorganic additives. The metal content has been determined by the AAS method and X-ray fluorescence analysis. The gaseous and liquid product have been analyzed using standard procedures, used in crude oil analysis. Quality, composition and properties of the products are given in Tables I and II.

TABLE I

Content of essential inorganic substances in the solid phase

| Substance | Unit | Value |
|---|---|---|
| $SiO_2$ | % by weight | 34.1 |
| $Al_2O_3$ | % by weight | 29.1 |
| Copper—Cu | % by weight | 14.5 |
| Lead—Pb | % by weight | 2.8 |
| Tin—Sn | % by weight | 4.8 |
| Iron—Fe | % by weight | 5.5 |
| Zinc—Zn | % by weight | 0.5 |
| Gold—Au | ppm (% by weight) | 650 (0.065) |
| Platinum—Pt | ppm (% by weight) | 400 (0.040) |
| Palladium—Pd | ppm (% by weight) | 160 (0.016) |
| Silver—Ag | ppm (% by weight) | 1200 (0.120) |
| Carbon—C | % by weight | 2.9 |

The overall content of noble metals (except silver) in the unsorted inorganic fraction has been 0.121% by weight, representing an amount of 1.21 kg in 1 ton of the inorganic product.

TABLE II

Quality of the liquid product

| Parameter | Unit | Value |
|---|---|---|
| Density at 20° C. | $kg \cdot m^{-3}$ | 886 |
| Viscosity at 40° C. | $mm^2 s^{-1}$ | 19.2 |

TABLE II-continued

Quality of the liquid product

| Parameter | Unit | Value |
| --- | --- | --- |
| Content of mechanical impurities | % by weight | 0.16 |
| Water content | % by weight | 0.08 |
| Ash content | % by weight | 0.21 |
| Inflammation point | ° C. | 61 |
| Solidification point | ° C. | 18 |
| Heating value | MJ/kg | 42.1 |

The liquid hydrocarbon condensate has constituted 31.4% by weight of the overall weight of organic substances of the batch of electronic scrap. The residue of 2.5% by weight has comprised gases (methane, light hydrocarbons up to C5, and $CO_2$), which could not condensate under the conditions created in the condensation system of the technological device.

INDUSTRIAL APPLICABILITY

Method of the present invention can be utilized in the industrial area of waste economy, oriented to preferred utilization and valuation of waste as a source of raw materials. The invention allows an economically and ecologically advantageous recycling waste electric or electronic devices and equipments, or their multicomponent, composite and combined parts, for example printed circuit boards, integrated circuits, microchips, memory modules and the like, as well as other complicated kinds of electric and electronic scrap.

The invention claimed is:

1. A method of processing multicomponent of composite and combined materials, the method comprising the steps of:
    mixing waste materials from electronic and electric devices and equipments, by using separated components, under the action of a moving bed of solid particles of a substance, yielding a mixture;
    performing whirling movement, characterized in that the treated materials are pretreated by removing contaminating components containing toxic heavy metals and polychlorinated biphenyls by grinding the waste to particles having the size of 5 to 25 mm; and
    subjecting the mixture in an inert environment at a temperature of 350° C. to 600° C. and at a pressure of 100 kPa to 10 MPa, to the action of blades of a rotational mechanism for 10 seconds to 10 minutes, wherein in the mixture occurs depolymerization, cracking and state transformation of macromolecular, solid and liquid organic fractions and their separation from the composite material in the form of organic vapors and gases, and disintegration of inorganic non-metallic fractions to small particles and increase of metal concentration in inorganic phase.

2. The method according to claim 1, characterized in that after removing the contaminating components containing toxic heavy metals and polychlorinated biphenyls and before the treatment in inert environment by the action of blades of a rotational mechanism iron parts are removed in a magnetic separator.

3. The method according to claim 2, characterized in that the treated materials are subjected to the action of blades of a rotational mechanism in an alkaline environment.

4. The method according to claim 2, characterized in that the solid particles of a substance, performing whirling movement, are formed partially or fully of a substance which acts under the reaction conditions catalytically on the running chemical reactions or it is a substance which is inert under the reaction conditions to the present reacting substances.

5. The method according to claim 1, characterized in that the treated materials are subjected to the action of blades of a rotational mechanism in the presence of lead and/or tin and/or zinc and/or mercury, added to the treatment process in an amount of 2 to 50% by weight.

6. The method according to claim 5, characterized in that the treated materials are subjected to the action of blades of a rotational mechanism in an alkaline environment.

7. The method according to claim 1, characterized in that the treated materials are subjected to the action of blades of a rotational mechanism in a reducing environment.

8. The method according to claim 7, characterized in that the reducing environment is formed by hydrogen and/or hydrogen releasing substances and/or gaseous products of depolymerization, cracking and state transformation of the macromolecular, solid and liquid organic fractions, which act as reducing agents.

9. The method according to claim 1, characterized in that the treated materials are subjected to the action of blades of a rotational mechanism in an alkaline environment.

10. The method according to claim 9, characterized in that the alkaline environment is formed by solid particles of a substance, performing whirling movement and acting as alkaline, which substance is a solid alkaline absorbent.

11. The method of claim 10 wherein the solid alkaline absorbent is selected from the set consisting of calcium oxide, calcium carbonate, calcium hydroxide, sodium hydroxide and potassium hydroxide.

12. The method according to claim 1, characterized in that the inert environment is formed by nitrogen and/or carbon dioxide and/or water vapor and/or gaseous products of depolymerization, cracking and state transformation of the macromolecular, solid and liquid organic fractions, which are inert or act as inert under the above conditions.

13. The method according to claim 1, characterized in that the solid particles of a substance, performing whirling movement, are formed partially or fully of a substance which acts under the reaction conditions catalytically on the running chemical reactions or it is a substance which is inert under the reaction conditions to the present reacting substances.

14. The method of claim 13 wherein the solid particles of a substance, performing whirling movement, are selected from the set consisting of granular quartz, silica sand, and aluminosilicates.

15. The method of claim 13 wherein the solid particles of a substance, performing whirling movement, are natural minerals containing silicon or aluminum or calcium or sodium or potassium or oxygen or sulfur.

16. The method of claim 13 wherein the solid particles of a substance, performing whirling movement, are synthetic minerals containing silicon or aluminum or calcium or sodium or potassium or oxygen or sulfur.

17. The method according to claim 1, characterized in that the solid particles of a substance, performing whirling movement, are formed partially or fully of a substance which results from disintegration of inorganic non-metallic fractions to the multicomponent, composite and combined materials to small particles and metal particles.

* * * * *